(12) United States Patent
Guyader et al.

(10) Patent No.: US 10,362,250 B2
(45) Date of Patent: *Jul. 23, 2019

(54) BACK-ILLUMINATED GLOBAL-SHUTTER IMAGE SENSOR

(71) Applicant: STMicroelectronics (Crolles 2) SAS, Crolles (FR)

(72) Inventors: Francois Guyader, Montbonnot (FR); Francois Roy, Seyssins (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

This patent is subject to a terminal disclaimer.

(21) Appl. No.: 15/985,998

(22) Filed: May 22, 2018

(65) Prior Publication Data
US 2018/0270439 A1 Sep. 20, 2018

Related U.S. Application Data

(63) Continuation of application No. 15/077,023, filed on Mar. 22, 2016, now Pat. No. 9,998,699.

(30) Foreign Application Priority Data

Nov. 9, 2015 (FR) ..................................... 15 60701

(51) Int. Cl.
| | |
|---|---|
| *H04N 5/353* | (2011.01) |
| *H04N 5/374* | (2011.01) |
| *H04N 5/378* | (2011.01) |
| *H01L 27/146* | (2006.01) |

(52) U.S. Cl.
CPC ....... *H04N 5/3742* (2013.01); *H01L 27/1463* (2013.01); *H01L 27/1464* (2013.01); *H01L 27/14614* (2013.01); *H01L 27/14623* (2013.01); *H01L 27/14629* (2013.01); *H01L 27/14634* (2013.01); *H04N 5/353* (2013.01); *H04N 5/378* (2013.01); *H01L 27/14643* (2013.01)

(58) Field of Classification Search
CPC ......... H01L 27/14614; H01L 27/14623; H01L 27/14629; H01L 27/1463; H01L 27/14634; H01L 27/1464; H01L 27/14643; H04N 5/353; H04N 5/3742; H04N 5/378

See application file for complete search history.

(56) References Cited

U.S. PATENT DOCUMENTS

| | | | |
|---|---|---|---|
| 8,207,590 B2 * | 6/2012 | Park | ................ H01L 27/14621 257/444 |
| 8,748,945 B2 | 6/2014 | Shin | |
| 9,236,407 B2 | 1/2016 | Roy et al. | |
| 9,318,520 B2 | 4/2016 | Fujii | |
| 9,842,871 B2 | 12/2017 | Yamaguchi | |

(Continued)

FOREIGN PATENT DOCUMENTS

EP 2674976 A1 12/2013

*Primary Examiner* — Chia Wei A Chen
(74) *Attorney, Agent, or Firm* — Slater Matsil, LLP

(57) ABSTRACT

A global shutter image sensor of a back-illuminated type includes a semiconductor substrate and pixels. Each pixel includes a photosensitive area, a storage area, a readout area and areas for transferring charges between these different areas. The image sensor includes, for each pixel, a protector extending at least partly into the substrate from the back of the substrate to ensure that the storage area is protected against back illumination.

22 Claims, 3 Drawing Sheets

(56) References Cited

U.S. PATENT DOCUMENTS

| | | |
|---|---|---|
| 2002/0154236 A1 | 10/2002 | Sakurai et al. |
| 2004/0115339 A1 | 6/2004 | Ito |
| 2004/0135063 A1 | 7/2004 | Dosluoglu |
| 2005/0082630 A1 | 4/2005 | Yamanaka |
| 2008/0203452 A1 | 8/2008 | Moon et al. |
| 2009/0096049 A1* | 4/2009 | Oshiyama ........... H01L 27/1461 257/432 |
| 2009/0179232 A1 | 7/2009 | Adkisson et al. |
| 2010/0118172 A1 | 5/2010 | McCarten et al. |
| 2010/0237451 A1 | 9/2010 | Murakoshi |
| 2011/0226934 A1 | 9/2011 | Tian et al. |
| 2011/0242376 A1* | 10/2011 | Ando ................ H01L 27/14623 348/294 |
| 2012/0019695 A1 | 1/2012 | Qian et al. |
| 2012/0248580 A1 | 10/2012 | Matsugai et al. |
| 2013/0026548 A1* | 1/2013 | McCarten ........... H01L 27/1464 257/294 |
| 2013/0070131 A1 | 3/2013 | Ohkubo et al. |
| 2013/0207214 A1 | 8/2013 | Haddad et al. |
| 2013/0334637 A1 | 12/2013 | Wang et al. |
| 2014/0078359 A1 | 3/2014 | Lenchenkov et al. |
| 2014/0131779 A1 | 5/2014 | Takeda |
| 2014/0135063 A1 | 5/2014 | Moran et al. |
| 2014/0151531 A1 | 6/2014 | Yamashita |
| 2014/0197301 A1 | 7/2014 | Velichko et al. |
| 2014/0217486 A1* | 8/2014 | Akiyama .......... H01L 27/14632 257/294 |
| 2014/0327051 A1 | 11/2014 | Ahn et al. |
| 2014/0346572 A1 | 11/2014 | Chen et al. |
| 2015/0054110 A1 | 2/2015 | Kashihara |
| 2015/0091114 A1 | 4/2015 | Mansoorian et al. |
| 2015/0179691 A1 | 6/2015 | Yanagita et al. |
| 2015/0212403 A1* | 7/2015 | Nam ...................... G03F 1/26 430/5 |
| 2015/0311259 A1* | 10/2015 | Joei .................. H01L 27/14636 250/208.1 |
| 2015/0372038 A1 | 12/2015 | Lee et al. |
| 2016/0118438 A1 | 4/2016 | Leung et al. |
| 2016/0211306 A1 | 7/2016 | Choi et al. |
| 2016/0218125 A1 | 7/2016 | Yamaguchi |
| 2016/0225815 A1 | 8/2016 | Um et al. |
| 2016/0276380 A1 | 9/2016 | Yang et al. |
| 2016/0315115 A1 | 10/2016 | Izuha et al. |
| 2016/0358966 A1 | 12/2016 | Borthakur et al. |
| 2017/0005121 A1 | 1/2017 | Lenchenkov et al. |
| 2017/0040375 A1 | 2/2017 | Kirby et al. |
| 2017/0117315 A1 | 4/2017 | Chen et al. |
| 2017/0133421 A1 | 5/2017 | Kobayashi et al. |
| 2017/0134670 A1 | 5/2017 | Chao et al. |
| 2017/0186804 A1 | 6/2017 | Takeuchi et al. |

* cited by examiner

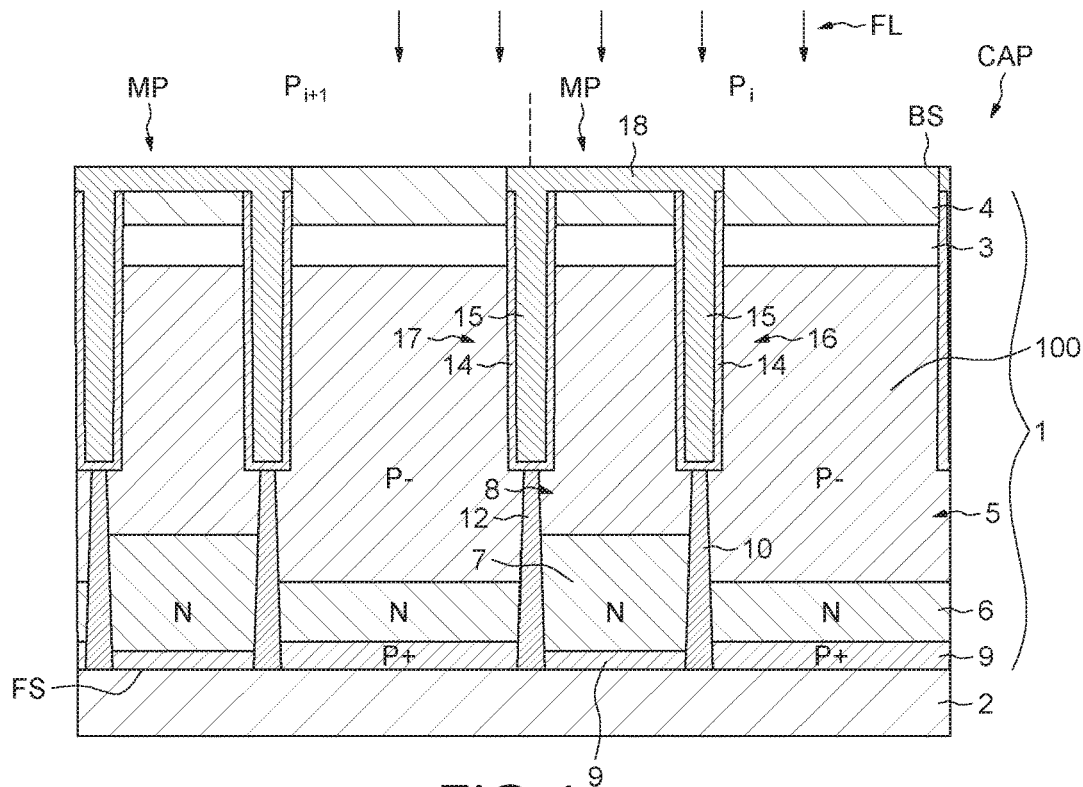
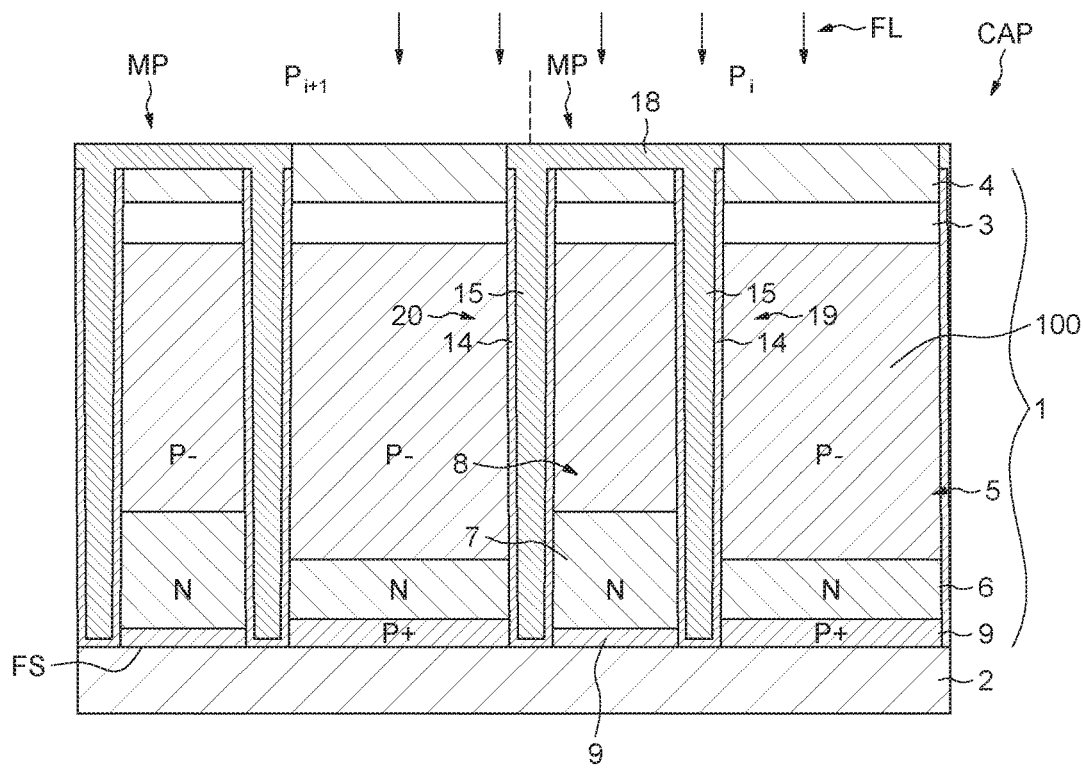

BACK-ILLUMINATED GLOBAL-SHUTTER IMAGE SENSOR

CROSS-REFERENCE TO RELATED APPLICATIONS

This application is a continuation of U.S. patent application Ser. No. 15/077,023, filed on Mar. 22, 2016, which claims priority to French Application No. 1560701, filed Nov. 9, 2015, both of which are hereby incorporated herein by reference in their entirety.

TECHNICAL FIELD

The present invention relate to image sensors, and in particular, to a global-shutter image sensor.

BACKGROUND

In a global-shutter image sensor all of the pixels are exposed simultaneously. This enables the capture of clearer images, notably when capturing moving objects.

A global-shutter sensor conventionally comprises a set of pixels, with each pixel comprising a photosensitive area, a storage area and a readout area. When the sensor is illuminated, electrons are generated and accumulate in the photosensitive area. A control circuit allows the simultaneous passage of the electrons from the photosensitive area to the storage area, then to the readout area. A non-limiting example of such a sensor and of its operation is described in published French patent application FR3000606.

Front-illuminated global-shutter image sensors exist but are difficult to integrate in three-dimensional integrated structures, notably due to the necessity to make the storage area opaque to minimize or reduce noise.

SUMMARY

According to one embodiment, a back-illuminated global-shutter image sensor integrated in a three-dimensional integrated structure is provided.

The integrated image sensor may be adapted to a control mode known as a global shutter, and comprises a semiconductor substrate and a plurality of pixels. Each pixel may comprise a photosensitive area, a storage area, a readout area and areas for transferring charges between these different areas.

The sensor may be of the back-illuminated type and may further comprise, for each pixel, protection means or a protector extending at least partly into the substrate from its back and configured to ensure that the storage area is protected against back illumination.

The protectors may take different forms. In certain cases they can be passive or active in the sense that they then carry out a transfer gate function. Furthermore, the protectors may also serve as light guides, notably for infrared radiation.

According to a first variation in which the protectors are passive, the storage area may be at least partially delimited by at least one first and second insulated vertical electrodes which extend from the front of the substrate. The first electrode may include a space corresponding to a first area for transferring charges between the photosensitive area and the storage area.

In this first variation, the protectors may, for example, comprise a single capacitive insulation trench which extends from the back into the elongation of the at least first and second insulated vertical electrodes to cover the storage area.

According to another variation, the protectors may comprise at least one first and second capacitive insulation trenches which extend into the substrate from its back, respectively opposite at least the first and second vertical electrodes. A screen may extend on the back of the substrate between the two trenches to cover the storage area.

To ensure a better optical insulation of the storage area, the protectors may non-electrically touch the first and the second insulated vertical electrodes. This notably makes it possible to limit still further the optical crosstalk phenomena familiar to the person skilled in the art.

It is also possible to leave a space between the protectors and the first and second insulated vertical electrodes. For example, the space may be on the order of 0.4 micrometers. According to another variation, part of the protectors may be active, i.e., each protector may comprise insulated vertical electrodes with an area for transferring charges.

In other words, the protectors ensure, in this case, on the one hand a function for protecting the storage area against the illumination from the back, and on the other hand, in the vicinity of the front, a function of insulated vertical electrodes which, with a suitable polarization, will ensure a charge-transfer function.

More specifically, according to one embodiment, the protectors may comprise at least one first and second capacitive insulation trenches extending into the substrate from its back and at least partially delimiting the storage area and forming, in the storage area, first and second insulated vertical electrodes. The first insulated vertical electrode may include a space corresponding to a first area for transferring charges between the photosensitive area and the storage area.

The protectors may also comprise a protection screen extending on the back of the substrate between the at least one first and second capacitive insulation trenches to cover the storage area. The capacitive insulation trenches may each extend up to the front of the substrate. This notably makes it possible, during a step for producing the trenches, to use, for example, the PMD (Pre-Metal Dielectric) dielectric layer of the BEOL portion located on the front of the substrate as an etch-stop layer.

The capacitive insulation trenches may also extend up to a localized implanted area located in the vicinity of the front of the substrate. This makes it possible to leave a space between the end of the trenches and the front of the substrate for potential implementation of components under the capacitive insulation trenches.

The protectors may comprise metal. Thus, the storage area may also be protected against infrared light rays. The insulation trenches may delimit the storage areas of two adjacent pixels while forming a waveguide for infrared rays reaching the photosensitive area of the pixel.

The image sensor may further comprise a control circuit adapted for applying control signals to the insulated vertical electrodes. Thus, by polarizing the electrodes to an adapted potential, it is possible to make the electrons migrate from one region to another.

According to another aspect, a three-dimensional integrated structure is provided. The structure may comprise a first electronic chip comprising an image sensor as described above, and a second electronic chip. The second electronic chip may comprise at least part of the control circuit. The two chips may be connected to one another by hybrid bonding of the metal-metal and insulator-insulator type.

BRIEF DESCRIPTION OF THE DRAWINGS

Other advantages and features of the invention will become apparent upon examining the detailed description of embodiments, which are in no way limiting, and the appended drawings, in which:

FIGS. 1 to 6 illustrate embodiments of the invention.

DETAILED DESCRIPTION OF ILLUSTRATIVE EMBODIMENTS

Figure 1:
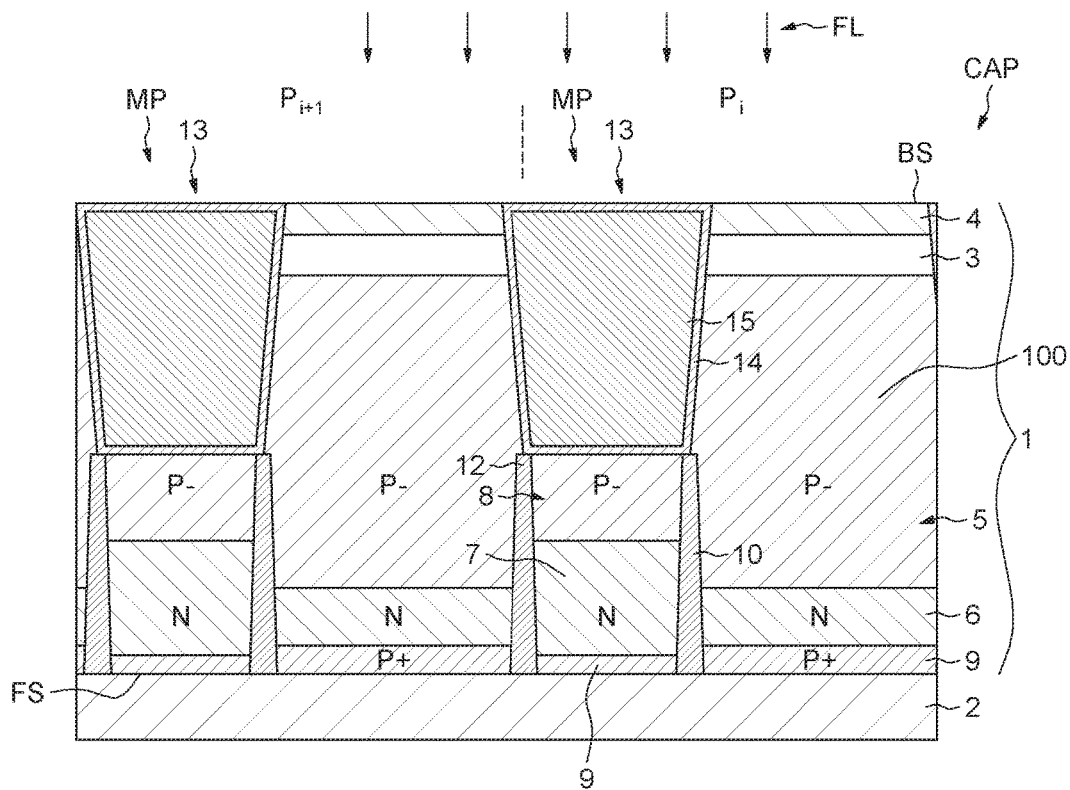

FIG. 1 is a cross-sectional representation of a global-illumination image sensor according to one embodiment. The image sensor CAP comprises a substrate 1 comprising a semiconductive region 100 with weak p-type doping.

The front FS of the substrate is surmounted (i.e., placed on top) by an interconnect region 2, commonly known to the person skilled in the art by the acronym BEOL (Back End Of Line). The interconnect region 2 is shown in part for the sake of simplification.

The substrate 1 furthermore comprises, on its back BS, an anti-reflective layer 3, surmounted by a layer 4 acting, as will be seen below, as a hardmask for the production of capacitive insulation trenches. The layer 4, for example, may be silicon nitride.

A pixel matrix has been produced in the substrate. Although the sensor comprises numerous pixels, only two identical and juxtaposed pixels $P_i$ and $P_{i+1}$ have been shown here for the sake of simplification.

Each pixel comprises a photosensitive area 5 comprising the stack of the semiconductive region boo, a first region 6 with n-type doping and a layer 9 with $p^+$-type doping, extending from the front of the substrate 1, forming a PNP photodiode. A storage area 8 is for storing charges, which is formed by the stack of the semiconductive region 100, of a second region 7 with n-type doping and of the layer 9. Each pixel also comprises a readout area 26, not shown in the sectional view of FIG. 1 but shown diagrammatically in FIG. 2.

Figure 2:
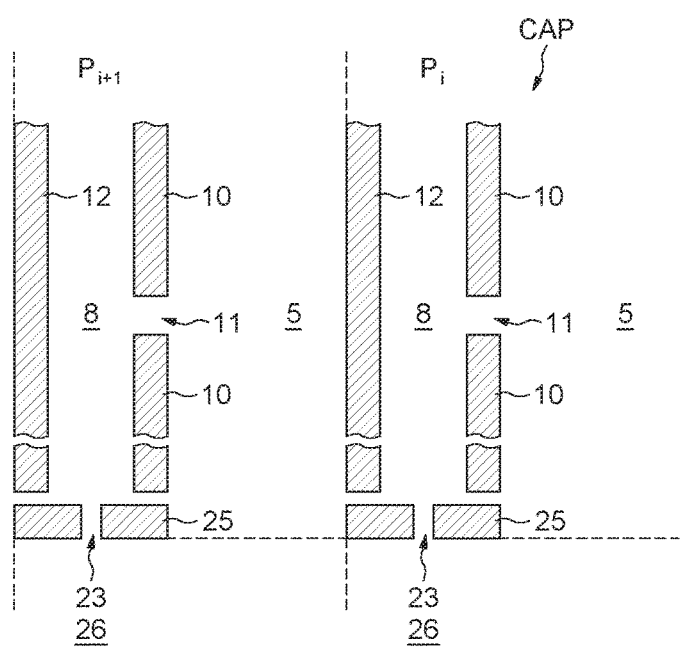

FIG. 2 is a highly diagrammatic top view of an exemplary layout for a photodiode and a storage area. It should be noted that this is only an example and that any other layout is conceivable. A first space corresponding to a first transfer gate 11 is located between the photodiode and the storage area. A second space corresponding to a second transfer gate 23 is located between the storage area and the readout area.

The storage area 8 is delimited by a first insulated vertical electrode 10, a second insulated vertical electrode 12 and a third insulated vertical electrode 25 (not shown in FIG. 1 for the sake of simplification). Each of the electrodes 10, 12 and 25 extend into the substrate from its front.

In this example, the depths of the electrodes are greater than the depths of the first and second implanted regions 6 and 7. For example, the electrodes extend into the substrate to a depth of 4 micrometers. The photodiode 5 (photosensitive area) is, in this example, notably delimited by the first electrode 10 of the storage area of the pixel $P_{i+1}$, and by the second electrode 12 of the pixel $P_1$.

The first electrode 10 includes the space 11 which divides the first electrode 10 into two portions and which forms the first transfer gate. The third electrode 25 includes the space 23 which divides the third electrode 25 into two portions and which forms the second transfer gate.

The operation of such a sensor is briefly provided below. Initially, the substrate is fixed to a reference potential, for example, to ground, and the three electrodes 10, 12 and 25 to a potential below the reference potential. This causes an accumulation of holes along the walls of the electrodes, and thereby creates a potential barrier in the transfer area 11. The barrier blocks the exchanges of electrons between the photosensitive area 5 and the storage area 8. The barrier also creates a potential barrier in the transfer area 23 by blocking the exchanges of electrons between the storage area and the readout area. When the photodiode is illuminated, electron-hole pairs are photogenerated in the photodiode and the electrons are accumulated in the region 6.

Next, during a first transfer phase, the two portions of the first electrode 10 are polarized to the same first potential above the reference potential, for example, a potential of 2 volts. This causes the transfer of all of the accumulated electrons from the region 6 to the region 7 of the storage area 8, via the transfer gate 11. Once the transfer has been made, the first electrode 10 is once again polarized to the reference potential to keep the electrons in the region 7 of the storage area 8.

Then, during a second transfer phase, a second potential above the reference potential, for example, a potential of 2 volts, is applied to the two portions of the third electrode 25. This causes the transfer, via the transfer gate 23, of all of the stored electrons from the region 7 to the readout area 26. Here the value of the pixel will be read out by a readout circuit, which is not shown in the diagram for the sake of simplification.

In FIG. 1, the image sensor CAP is back illuminated. When the sensor is illuminated, the luminous flux FL therefore reaches the back BS of the substrate. Each storage area 8 should therefore be protected from the light to avoid unwanted signals as much as possible. Thus, in this example, each storage area 8 is protected from the light by protection means or protector MP.

In this embodiment, the protector MP for the pixel $P_i$ comprise a single capacitive insulation trench 13 which extends from the back of the substrate opposite the three electrodes 10, 12 and 25. This is to cover the storage areas and partially delimit the photodiodes 5 of the pixels $P_i$ and $P_{i+1}$.

In this example, the walls of the capacitive insulation trenches 13 are covered by an insulating material 14, for example, silicon oxide. The trenches are filled with a metallic material 15, for example, copper.

It should be noted that not only does the capacitive insulation trench 13 totally cover the storage area 8, but it additionally touches the three electrodes 10, 12 and 25, yet without being in electrical contact therewith. This contact is made by the insulating material 14 of the capacitive insulation trench.

However, to avoid any risk of electrical contact during the production of the trenches, provision can be made to leave a space between the capacitive insulation trench 13 and the electrodes 10, 12 and 25. For example, a space of 0.4 micrometer may be left. The trench can, for example, extend into the substrate to a depth of 2 to 16 micrometers.

The capacitive insulation trench 13 is adapted to be polarized to a third potential below the reference potential, for example, −3 volts. This is notably to limit the dark current. The capacitive insulation trenches of the image sensor are passive, i.e., they do not act as transfer electrodes. However, they do form waveguides for infrared rays.

FIG. 3 illustrates an embodiment in which the protector MP for the pixel Pi comprises a first capacitive trench 16 extending from the back of the substrate 1 opposite the first electrode 10, a second capacitive insulation trench 17 extending from the back of the substrate 1 opposite the second electrode 12, and a third capacitive insulation trench, not shown in FIG. 3, extending from the back of the substrate 1 opposite the third insulated vertical electrode 25.

Each capacitive insulation trench extends into the substrate over a length of 2 to 16 micrometers and is in mechanical contact, without being in electrical contact, with the electrode facing it. Each capacitive insulation trench also comprises an insulating layer 14 of silicon oxide and a copper filling 15. Once again, it would be possible to leave a space on the order of 0.4 micrometers between each capacitive insulation trench and the electrode facing it.

The protector furthermore comprises an opaque screen 18, for example, metallic, which extends from the back of the substrate 1 to cover the storage area 8 completely. The screen 18 is in contact with the two capacitive insulation trenches 16 and 17, and with the third capacitive insulation trench.

The insulation trenches 16 and 17, the third insulation trench and the opaque screen may be produced during the same process step, for example, a process known as dual-damascene that is familiar to the person skilled in the art, and therefore comprises the same material. In this example, the trenches 16 and 17, as well as the opaque screen 18, comprise the same metal 15, such as copper, for example.

Once again, the capacitive insulation trenches 16 and 17 and the third capacitive insulation trench are adapted to be polarized to a potential below the reference potential, for example, −3 volts. This is notably in order to limit the dark current. Once again, the capacitive insulation trenches 16 and 17 form waveguides, notably for infrared rays.

FIG. 4 illustrates an embodiment in which the protector MP comprises the insulated vertical electrodes. In this embodiment, the protector MP for the pixel $P_i$ comprises a first capacitive trench 19, a second capacitive insulation trench 20, a third capacitive insulation trench, and an opaque protection screen 18.

The first capacitive trench 19 extends into the substrate from its back to its front. This is between the photosensitive area 5 and the storage area 8.

The second capacitive insulation trench 20 extends into the substrate from its back to its front. This is between the storage area 8 and the photosensitive area of the neighboring pixel.

The third capacitive insulation trench, not shown in FIG. 4, extends into the substrate from its back to its front, between the storage area 8 and the readout area 26. The three capacitive insulation trenches thereby delimit the storage area 8.

The opaque protection screen 18 extends on the back BS of the substrate between the two capacitive insulation trenches 19 and 20 to cover the storage area 8. The first capacitive insulation trench 19 includes a space in its lower part. This corresponds to the gate for transferring charges 11 between the photosensitive area 5 and the storage area 8.

The third capacitive insulation trench (not shown) also includes a space in its lower part. This corresponds to the gate for transferring charges 23 between the storage area 8 and the readout area 26.

The first capacitive trench 19 and the third capacitive trench are active, i.e., they act as charge-transfer gates in their lower parts. The second capacitive insulation trench 20 is passive here.

Figure 5:
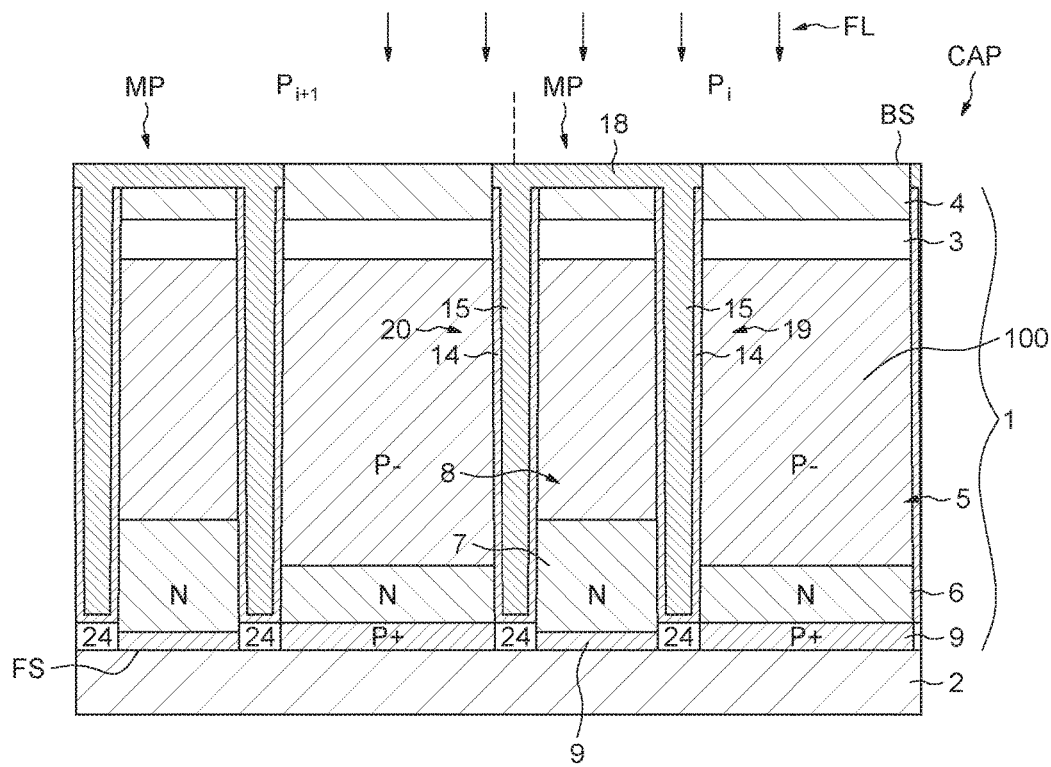

According to another embodiment, illustrated in FIG. 5, the front of the substrate furthermore comprises localized implanted areas 24 located on both sides of each storage area 8. The capacitive insulation trenches each extend up to an implanted area 24. These implanted areas 24 can accommodate electronic components, for example, transistors.

To produce a sensor as described above, a semiconductor substrate is taken as the starting point. On its front the various implanted areas of the various pixels are produced, as well as the electrodes 10, 12 and 25 (FIGS. 1 and 3). Then the interconnect portion (BEOL) on the front of the substrate is produced.

Next, the substrate is turned over and the substrate is thinned from its back. Next, the protectors MP are produced by etching and filling with metal, according to one of the embodiments described previously and illustrated in FIGS. 1 to 5. In the case of FIGS. 4 and 5, the capacitive insulation trenches of the protectors MP also form the vertical electrodes.

Figure 6:
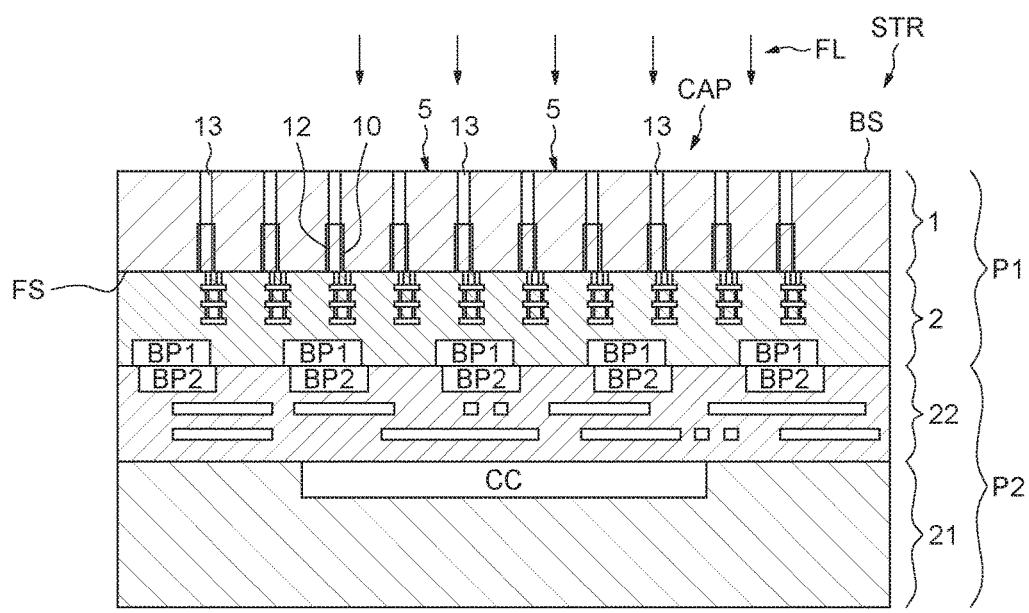

FIG. 6 illustrates an embodiment in which an image sensor CAP according to the embodiment described previously and illustrated in FIG. 1 has been integrated in a three-dimensional integrated structure STR. The integrated structure STR comprises a first chip P1 comprising the sensor CAP, and a second chip P2 comprising a control logic circuit, for example.

The first chip P1 comprises a plurality of pixels $P_i$, $P_{i+1}$, $P_{i+2}$, etc. Each pixel comprises a photosensitive area 5 and a memory area 8 protected by the single capacitive insulation trench 13. The interconnect portion of the first chip P1 comprises first bonding pads BP1 which comprise copper and which extend from its front.

The second chip P2 comprises a semiconductor substrate 21, surmounted by an interconnect region 22.

The interconnect region 22 of the second chip P2 comprises metal levels and vias which between them connect the various electronic components of the second chip P2, as well as bonding pads BP2 comprising copper located on its front.

The two chips P1 and P2 are joined to one another by hybrid bonding. The hybrid bonding may be metal-metal and insulator-insulator. The control circuit CC intended to control the sensor and notably to polarize the various electrodes is located in the substrate of the chip P2.

It would also be possible for the control circuit CC to be located partly in the chip P2 and partly in the chip P1, or even entirely in the chip P1. Similarly, the chip P2 could be a simple support, known to the person skilled in the art by the term interposer.

Although a three-dimensional integrated structure STR comprising an image sensor according to the embodiment described in FIG. 1 has been described, such a structure is compatible with the other embodiments described previously.

Furthermore, although capacitive insulation trenches comprising copper have been described, the embodiments described previously are compatible with any type of metal, notably tungsten. Tungsten can advantageously be used for filling trenches with a very large aspect ratio (i.e., the ratio of height to width).

What is claimed is:

1. A method of operating a back-illuminated image sensor, the method comprising:

during an initial phase, applying a reference voltage to a substrate that comprises a hardmask layer disposed at a back of the substrate, and an anti-reflective layer that is in physical contact with the hardmask layer, and applying a first voltage to first, second and third insulated vertical electrodes of a pixel, the first, second and third insulated vertical electrodes being spaced apart and extending from a front of the substrate to at least partially delimit a storage area of the pixel, the first electrode including a first space corresponding to a first area for transferring charges between a photosensitive area of the pixel and the storage area, the third electrode including a second space corresponding to a second area for transferring charges between the storage area and a readout area of the pixel, wherein the first voltage is lower than the reference voltage, the pixel comprising a protector extending at least partly into the substrate from the back of the substrate and through the hardmask and anti-reflective layers;

during a first transfer phase, polarizing portions of the first electrode to a second voltage higher than the reference voltage;

during a second transfer phase, polarizing portions of the third electrode to a third voltage higher than the reference voltage; and reading out a value of the pixel.

2. The method of claim 1, further comprising polarizing the first electrode to the reference voltage after the first transfer phase.

3. The method of claim 1, further comprising polarizing a capacitive insulation trench of the protector to a fourth voltage that is below the reference voltage.

4. The method of claim 3, further comprising forming waveguides with the capacitive insulation trench for infrared rays.

5. The method of claim 1, wherein the reference voltage is ground.

6. The method of claim 1, wherein the second voltage is equal to the third voltage.

7. A method of manufacturing a back-illuminated image sensor, the method comprising:

forming implanted areas in a front of a semiconductor substrate;

forming first, second and third insulated vertical electrodes of a pixel, the first, second and third insulated vertical electrodes being spaced apart and partly delimiting a storage area of the pixel, the first electrode including a first space corresponding to a first area for transferring charges between a photosensitive area of the pixel and the storage area, and the third electrode including a second space corresponding to a second area for transferring charges between the storage area and a readout area of the pixel; and forming a protector that extends at least partly into the semiconductor substrate from a back of the semiconductor substrate and through a hardmask layer and an anti-reflective layer of the semiconductor substrate by etching and filling with metal.

8. The method of claim 7, further comprising forming an interconnect portion on the front of the semiconductor substrate.

9. The method of claim 7, further comprising thinning the back of the semiconductor substrate before forming the protector.

10. The method of claim 7, further comprising:

forming an opaque screen of the protector, the opaque screen extending from the back of the semiconductor substrate and covering the storage area; and forming a capacitive insulation trench of the protector, the capacitive insulation trench extending from the back of the substrate through the hardmask and anti-reflective layers.

11. The method of claim 10, wherein forming the opaque screen and the capacitive insulation trench are formed in a same dual-damascene process.

12. A back-illuminated image sensor comprising:

a substrate comprising a hardmask layer disposed at a back of the substrate, and an anti-reflective layer in physical contact with the hardmask layer; and a plurality of pixels in the substrate, each pixel comprising:

a photosensitive area, a storage area, a readout area, areas for transferring charges between the photosensitive, storage and readout areas, and a protector configured to protect the storage area against back illumination, the protector extending at least partly into the substrate from the back of the substrate and through the hardmask and anti-reflective layers.

13. The back-illuminated image sensor of claim 12, wherein the hardmask layer comprises silicon nitride.

14. The back-illuminated image sensor of claim 12, wherein each pixel further comprises spaced apart first, second and third insulated vertical electrodes which extend from a front of the substrate to at least partially delimit the storage area, the first electrode including a first space corresponding to a first area for transferring charges between the photosensitive area and the storage area, and the third electrode including a second space corresponding to a second area for transferring charges between the storage area and the readout area.

15. The back-illuminated image sensor of claim 14, wherein the protector comprises a capacitive insulation trench that extends from the back of the substrate through the hardmask and anti-reflective layers toward the first and second insulated vertical electrodes to cover the storage area.

16. The back-illuminated image sensor of claim 15, wherein the capacitive insulation trench is filled with a metallic material, the capacitive insulation trench having walls covered by an insulating material.

17. The back-illuminated image sensor of claim 16, wherein the metallic material comprises copper, and the insulating material comprises silicon oxide.

18. The back-illuminated image sensor of claim 15, wherein the capacitive insulation trench is spaced apart from the first and second insulated vertical electrodes by a first distance.

19. The back-illuminated image sensor of claim 18, wherein the capacitive insulation trench extends into the substrate to a depth between 2 um and 16 um from the back of the substrate, and wherein the first distance comprises 0.4 um.

20. The back-illuminated image sensor of claim 15, wherein the capacitive insulation trench is a single capacitive insulation trench.

21. The back-illuminated image sensor of claim 15, wherein the capacitive insulation trench is in physical contact with the first, second and third insulated vertical electrodes.

22. The back-illuminated image sensor of claim 15, wherein the capacitive insulation trench forms a waveguide for infrared rays.

* * * * *